United States Patent [19]

Masuda et al.

[11] 3,943,303
[45] Mar. 9, 1976

[54] ABNORMAL SOUND ELIMINATING SYSTEM IN RECORD DISC REPRODUCING APPARATUS

[75] Inventors: Isao Masuda, Sagamihara; Masami Yamazaki, Zama, both of Japan

[73] Assignee: Victor Company of Japan, Ltd., Yokohama, Japan

[22] Filed: July 17, 1974

[21] Appl. No.: 489,112

[30] Foreign Application Priority Data
Aug. 13, 1973 Japan.............................. 48-90009

[52] U.S. Cl. .................. 179/100.4 D; 179/100.4 E
[51] Int. Cl.² ... H03D 3/18; G11B 3/04; H03D 3/24
[58] Field of Search 179/100.4 A, 100.4 D, 100.4 E, 179/100.4 ST, 100.4 F; 360/28, 29, 30; 329/103, 122

[56] References Cited
UNITED STATES PATENTS
2,559,902   7/1951   Scott........................... 179/100.4 D
3,843,850   10/1974   Takahashi et al. ......... 179/100.4 ST
3,854,098   12/1974   Takahashi et al. ......... 179/100.4 ST

*Primary Examiner*—Bernard Konick
*Assistant Examiner*—Jay P. Lucas

[57] ABSTRACT

In a record disc reproducing apparatus, an abnormal sound eliminating system comprises a variable filter in the transmission system for a signal reproduced from a record disc. The filter does not pass the signal band, which is variable. A control signal generator produces a control signal in accordance with the frequency of a carrier wave reproduced from a multichannel record disc. The non-passed signal band of the variable filter is variably controlled by the control signal from the control signal generator, to eliminate a carrier wave reproduced with a frequency lower than a specific frequency. This low frequency wave appears when the multichannel record disc rotates at a low speed, less than a specific normal rotational speed. This limitation prevents the generation of abnormal sound due to the reproduced carrier wave of low frequency.

6 Claims, 6 Drawing Figures

ABNORMAL SOUND ELIMINATING SYSTEM IN RECORD DISC REPRODUCING APPARATUS

BACKGROUND OF THE INVENTION

The present invention relates to a system for eliminating abnormal sounds in a record disc reproducing apparatus. More particularly it relates to a system for preventing the generation of unpleasant sounds at the start of reproducing a multichannel record disc on which an angle-modulated wave has been recorded, or at the time of searching for detection of the starting point of a sound recording.

In general, there are instances when a pickup of a disc reproducing apparatus is left on a soundless groove in front of the point where a sound recording begins on a recorded disc. With the pickup at this point, the rotation of the record disc is started to reproduce or play the sound recording. Such a procedure is also carried out with a two-channel record disc reproducing apparatus, of ordinary type for home use. Furthermore, this kind of start is also used during a disc jockey program in a broadcasting station.

On a discrete multichannel record, an angle-modulated wave signal is recorded in a superimposed state with a direct wave signal. An unmodulated carrier component of 30 KHz is recorded in the soundless part of the groove. A discrete multichannel record can be reproduced also in an apparatus for reproducing two-channel stereo record discs.

While the pickup is tracing the soundless groove part of the record disc, at the start of reproduction by the above mentioned procedure, the disc starts rotating from its stopped state, comes up to speed, and eventually reaches its normal rotational speed. Accordingly, until the disc reaches this normal speed, it is rotating at lower than normal speeds. While the disc is thus rotating at lower speeds, the carrier component is reproduced as a signal of a frequency in the audio frequency band and is heard as an abnormal and unpleasant sound (sweep sound).

The above mentioned search for the starting point of the sound recording is accomplished by turning the turntable, on which the record disc is placed, in either of the two opposite directions. During this procedure, abnormal sound is also generated to give an unpleasant sensation and difficulty in finding the starting point for the sound recording.

In order to eliminate such abnormal sounds, a known system detects the difference between the waveform of the carrier wave in the sound containing groove part and the waveform of the carrier wave in the soundless groove part. The reproduced signal transmission path is cut off while the pickup is tracing the soundless part of the groove. This prevents the reproduction and generation of abnormal sounds. More specifically, only unmodulated carrier waves of the same phase are recorded on the left and right channel walls in the soundless part of the groove. A carrier wave angle modulated by a difference signal and multiplexed on a direct wave sum signal is recorded in the sound containing groove part. For this reason, the difference between the left and right channel signals is determined. The difference becomes zero responsive to the soundless groove part. There is a difference output responsive to the sound containing groove part. Therefore, the soundless groove part and the sound containing groove part are distinguished and detected.

In the above described known system, the carrier waves recorded in the left and right channels in the soundless groove part of the disc are not necessarily of mutually the same phase. Even if they are of the same phase, the carrier waves of the left and right channels, reproduced by the pickup, may become different in phase as a result of the characteristic of the pickup. Consequently, the distinguishing and detection of the soundless groove part and the sound containing part cannot be carried out positively. The transmission path of the reproduced signal cannot be positively cut off while the pickup is tracing the soundless groove part.

In this connection, the generation of the above mentioned abnormal sounds may be considered as follows. The frequency of the unmodulated carrier wave recorded on a discrete four-channel record, for example, is 30 KHz. For this reason, if the record disc is rotated at less than the normal speed, the carrier wave component is reproduced as a signal within the frequency range of 0 to 30 KHz. If the carrier wave thus reproduced is in the audio frequency band, particularly within the frequency band of from 300 Hz to 10 KHz, the sound of the reproduced carrier wave is sensed as an abnormal sound of maximum unpleasantness.

The greater part of the energy of the audio signal resides in a band from 500 Hz to 5 KHz. If the carrier wave is reproduced with a 300 Hz to 10 KHz frequency, the greater part of the energy of the audio signal shifts to approximately 50 Hz to 1.7 KHz, and is thus reproduced.

Accordingly, one measure for eliminating abnormal sounds due to reproduction of the carrier wave at a frequency in the audio band when the record disc is rotated below the normal speed, is to increase the signal passing band of the reproducing signal transmission system from approximately 100 Hz, as the reproduced carrier wave frequency increases.

As a result of experiments relating to aural sensation, it was found that, while audio signals can be distinguished, the sound of the reproduced carrier wave can be prevented from being heard by attenuating the level of the reproduced carrier wave to less than 40 dB.

SUMMARY OF THE INVENTION

Accordingly, it is a general object of the present invention to provide a novel and useful system wherein abnormal sounds of the reproduced carrier wave are eliminated while the record disc is rotating at less than the specified normal speeds.

Another object of the invention is to provide a system for preventing noise if the record playing is started when the pickup is resting on a soundless groove part of a multichannel record disc as described above, a search is being made for the starting point of the sound recording on the record, or in similar cases. Here, an object is to prevent reproduction and emission of an unpleasant sweep sound (abnormal sound) due to reproduction of a carrier component from the record while it is rotating at low speed.

Still another object of the invention is to provide a system in which, depending upon the frequency of an unmodulated carrier wave reproduced from a multichannel record disc, the frequency response characteristic of the signal transmission system is varied to prevent transmission of the reproduced carrier wave and thereby to prevent the generation of an abnormal sound due to a carrier wave reproduced with a lower than normal frequency.

A further object of the invention is to provide a system in which a variable low-pass filter is provided in the reproduced signal transmission system. Here, an object is to eliminate the reproduced carrier wave when a multichannel record disc is rotated at less than a normal rotational speed. For this object the cut-off frequency of the variable low-pass filter is varied in accordance with the frequency of the carrier wave thus reproduced.

Other objects and further features of the invention will be apparent from the following detailed description when read in conjunction with the accompanying drawings, briefly described below.

DETAILED DESCRIPTION

Figure 1:
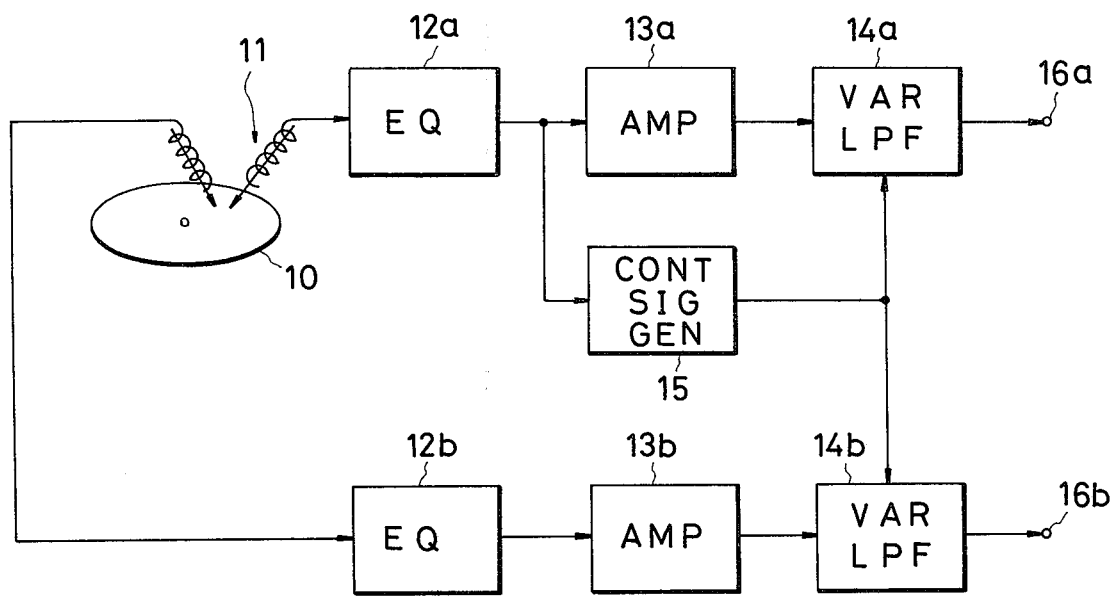
FIG. 1 is a block diagram schematically showing the essential organization of one embodiment of a system for eliminating abnormal sounds in an apparatus for reproducing a multichannel record disc.

The general operation of an inventive system for the reproduction of a discrete four-channel record disc, by means of a two-channel stereo record disc reproducing apparatus, will be first described with reference to FIG. 1.

Of the signals picked up by a pickup cartridge 11 from a four-channel record disc 10, the signal of the left channel is supplied through an equalizer 12a to an amplifier 13a and a control signal generator 15, as described hereinafter. The reproduced signal amplified by the amplifier 13a is fed to a variable low-pass filter 14a which has an attenuation characteristic with a slope of 12 dB/oct. Moreover, the filter varies its cut-off frequency characteristic.

On the other hand, the signal of the right channel picked up by the pickup cartridge 11 is fed through an equalizer 12b and an amplifier 13b to a variable low-pass filter 14b.

The control signal generator 15 produces an output control signal of a voltage which varies in accordance with the frequency of the picked up input carrier wave. This control signal is applied to the variable low-pass filters 14a and 14b, the cut-off frequencies of which are varied in accordance with the control signal voltage thus applied.

With the pickup cartridge 11 resting on the soundless groove part of the record disc, the disc is turned at low speed in order to search for and find the starting point of the recorded sound. The unmodulated carrier wave of 30 KHz, recorded in the soundless groove part, is reproduced with a frequency which is much lower than 30 KHz.

The control signal generator 15 generates a control signal of a DC voltage in accordance with the frequency of this reproduced carrier wave. The variable low-pass filters 14a and 14b are controlled by this control signal. Their cut-off frequencies are varied to prevent passage of substantially all of the above mentioned reproduced carrier wave. The signals which have passed through the variable low-pass filters 14a and 14b are sent through output terminals 16a and 16b to circuits of succeeding stages. In the case where the record disc reproducing apparatus is a four-channel record disc reproducing apparatus, the signals from the output terminals 16a and 16b are sent to a demodulation circuit system of a later stage.

A carrier wave component would become an abnormal sound if it is reproduced with a frequency considerably lower than 30 KHz. It is effectively removed by the variable low-pass filters. For this reason, a generation of abnormal sound at the time of low-speed rotation of the record disc, as mentioned hereinbefore, is prevented.

The above mentioned variable low-pass filters 14a and 14b are of the same circuit organization and will hereinafter be referred to representatively as a variable low-pass filter 14.

One embodiment of a specific circuit organization of this variable low-pass filter 14 will now be described with reference to FIG. 2. A signal from the amplifier 13 in the system illustrated in FIG. 1 is applied to an input terminal 20 of this filter 14 and is fed by way of two field-effect transistors (FETs) 21 and 22 to one input terminal 24a of an operational amplifier 23. A capacitor 26 is connected between this input terminal 24a and ground (earth). Furthermore, a signal thus obtained at the junction between the FETs 21 and 22 is supplied by way of a capacitor 25 to another input terminal 24b of the operational amplifier 23. A feedback signal from the output side of the operational amplifier 23 is also supplied to this input terminal 24b. In order to obtain good characteristics of the FETs 21 and 22, it is desirable that they are dual-FETs.

Figure 2:
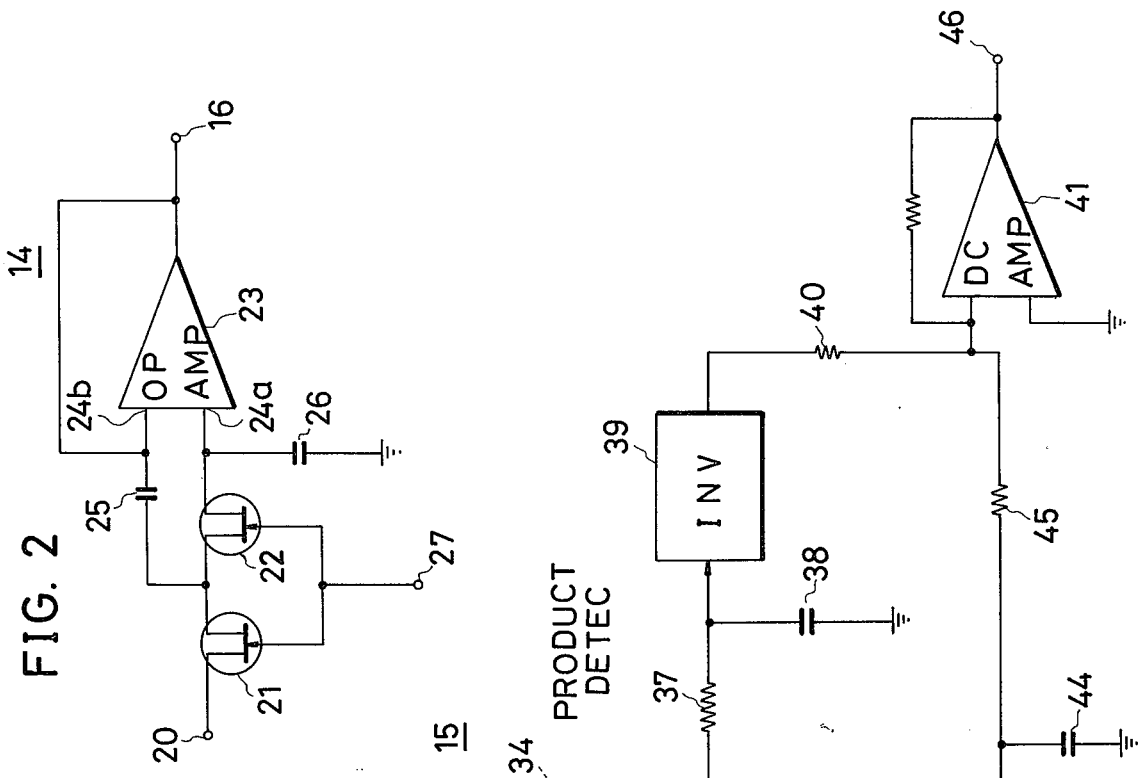
FIG. 2 is a circuit diagram showing one embodiment of a variable low-pass filter in the system illustrated in FIG. 1.

On one hand, a control signal from the control signal generator 15 of the system shown in FIG. 1 is applied by way of a terminal 27 to the gates of the FETs 21 and 22, which thereupon vary their internal resistances in accordance with the voltage of the control signal thus applied to their gates.

The capacitances of the capacitors 25 and 26 are respectively denoted by C1 and C2. The internal resistances of the FETs 21 and 22 are each denoted by $R_F$. The relationship C1 = 2C2 is selected. The circuit shown in FIG. 2 becomes a low-pass filter with a Butterworth characteristic $$f = \frac{1}{2\pi \, C1 \, R_F}$$

exhibiting an attenuation characteristic 12 dB/oct. Furthermore, since the internal resistances $R_F$ of the FETs 21 and 22 vary in accordance with the control signal voltage applied to the terminal 27, it is possible to vary the cut-off frequency of this low-pass filter in accordance with this control signal, for example, from 50 Hz to 20 KHz.

In this connection, the band of the audio signal transmission system can be broadened. The sound signal recorded in the sound containing groove part of the disc can be reproduced clearly from the beginning part thereof by connecting low-pass filters, as described above, in cascade connection to form a plurality of stages.

Figure 3:
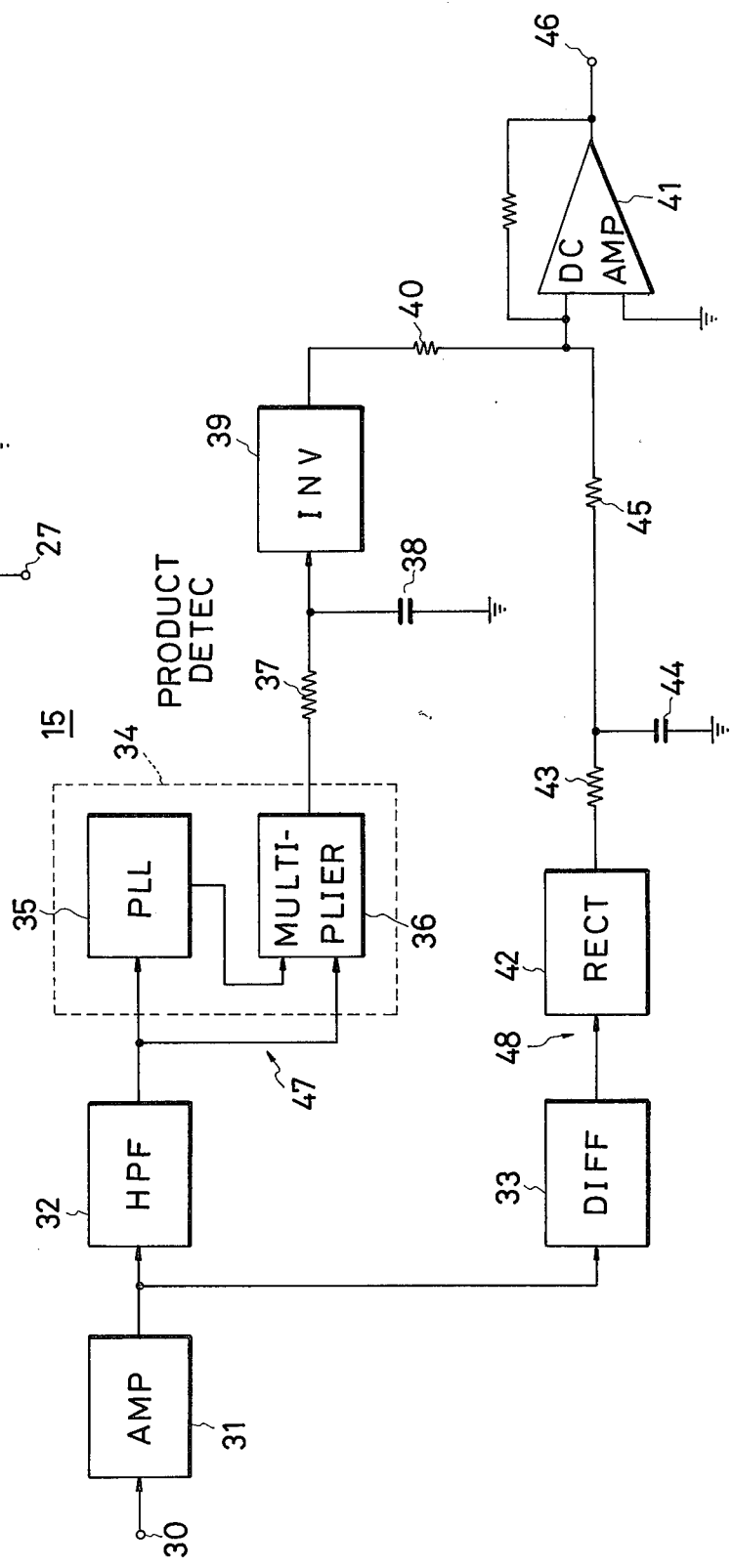
FIG. 3 is a block diagram showing one embodiment of a control signal generator in the system illustrated in FIG. 1.

An embodiment of a specific control signal generator 15 will now be described with reference to FIG. 3. A signal from the equalizer 12 in FIG. 1 is applied on an input terminal 30. After being amplified by an amplifier 31, it is supplied to a high-pass filter 32 and a differentiation circuit 33. The high-pass filter 32 has a cut-off frequency of 20 KHz, and the signal supplied thereto is rid of its unnecessary low-frequency component.

The output signal of the high-pass filter 32 is supplied to a phase-locked loop (PLL) 35 and a multiplier 36 in a product detection circuit 34. The self-running oscillation frequency $f_o$ of the PLL 35 is 30 KHz, which is equal to the frequency of the carrier wave reproduced when the record disc is rotating at normal speed. A triangular wave of the output of a voltage-controlled oscillator (VCO) in the above mentioned PLL 35 is supplied to a carrier input terminal of the multiplier 36. The aforementioned signal from the high-pass filter 32 is supplied to another input terminal of the multiplier 36. Accordingly, when the high-pass filter 32 produces as output a signal of a band corresponding to the lock range of the PLL 35 set at from 20 KHz to 40 KHz, the PLL 35 locks to the input signal thereof. A signal synchronized with the carrier wave frequency is obtained from the multiplier 36.

The output of the multiplier 36 is integrated by an integration circuit comprising a resistor 37 and a capacitor 38. The integrated signal is inverted by an inverter 39 and is then supplied by way of a resistor 40 to a DC amplifier 41. The circuit system 47 comprising the above mentioned high-pass filter 32, product detector 34, integration circuit, and inverter 39 is provided for generating a control signal when the record disc is rotating at the normal speed or at a speed close thereto. Moreover, it generates a stable control signal when the level of the carrier wave recorded on the record disc fluctuates and when the level becomes too low.

On one hand, as mentioned hereinabove, the amplified signal from the amplifier 31 is supplied also to the differentiation circuit from which a signal proportional to the frequency thereof is derived. For this differentiation circuit 33, a high-pass filter having a cut-off frequency higher than 30 KHz, for example, is used. An output signal proportional to the frequency of the input signal is supplied from the differentiation circuit 33 to a rectification circuit 42 and is there rectified. Since an ample dynamic range is required for deriving a DC voltage proportional to the frequency, it is necessary to use a half-wave rectification circuit or a full-wave rectification circuit in which an operational amplifier is employed for the rectification circuit 42.

The output of the rectification circuit 42 passes through an integration circuit comprising a resistor 43 and a capacitor 44. Then, it is supplied by way of a resistor 45 to the above DC amplifier 41.

The circuit system 48 comprises the differentiation circuit 33, rectification circuit 42, and integration circuit 43, 44. Circuit 48 gives a DC voltage which is substantially proportional to the carrier frequency at the time of low-speed rotation of the record disc.

The DC voltage supplied by way of the resistors 40 and 45, respectively, to the DC amplifier 41 is here amplified and then lead out through an output terminal 46. That signal is a control signal applied to the terminal 27 of the variable low-pass filter 14 shown in FIG. 2.

When the characteristic of the cartridge is considered, it is desirable to provide a variable resistor for gain adjustment in the circuit system 48, within the control signal generator 15, in order to impart an optimum characteristic to the variable low-pass filter with respect to the carrier frequency at the time of low-speed rotation of the disc.

When the pickup 11 is resting on the stopped disc 10, which is started in rotation, for example, the circuit system 48, in the control signal generator 15 operates while the disc is rotating at a relatively low speed. The cut-off frequency of the variable low-pass filter 14 is controlled by a control signal, which varies in accordance with the frequency of the reproduced carrier wave, from the control signal generator 15. The variable low-pass filter 14 exhibits a low-pass filtering characteristic wherein its cut-off frequency is 50 Hz when the record disc is stopped. Its cut-off frequency progressively increases with increase in the rotational speed of the disc.

The variable cut-off frequency in this case continually removes the carrier wave reproduced with a frequency below the specified frequency (30 KHz) when the disc is rotating at a speed lower than the normal disc speed and filters frequencies. For example, when the reproduced carrier wave frequency is from 3 KHz to 5 KHz, the cut-off frequency of the variable low-pass filter is in the range from 100 Hz to 300 Hz.

Figure 4:
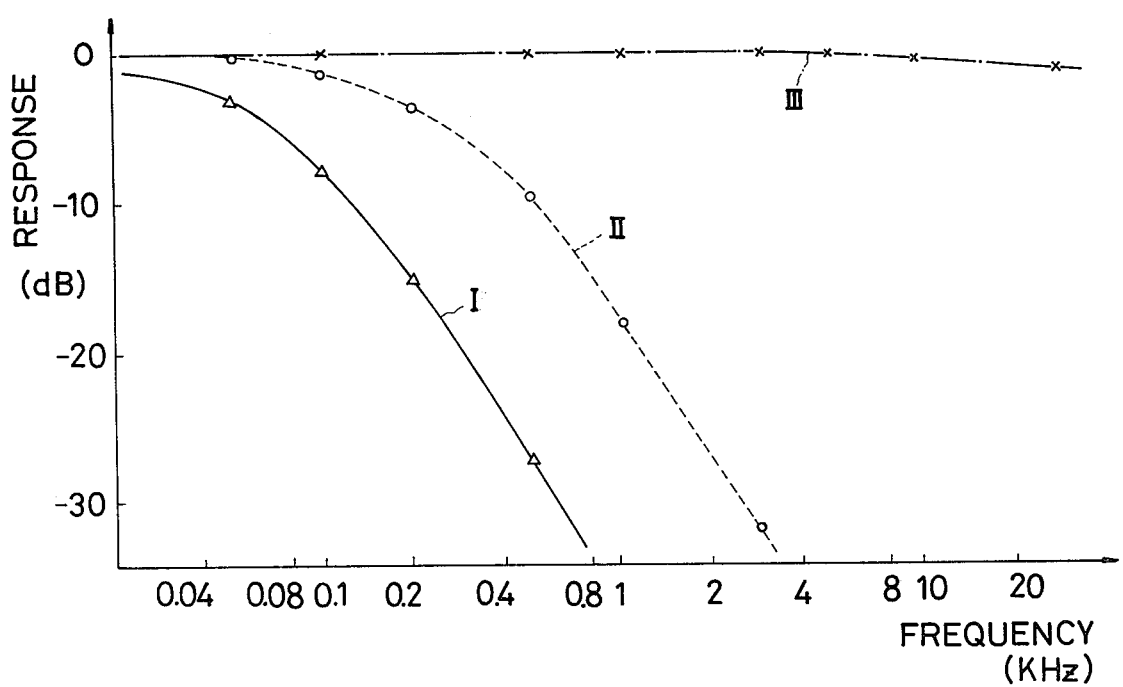
FIG. 4 is a graph indicating signal transmission frequency characteristics in the system of the invention.

The frequency response characteristic of the variable low-pass filter 14 is indicated in FIG. 4. In this graph, curve I gives the frequency response characteristic of the variable low-pass filter 14, controlled by a control signal in accordance with the frequency of the reproduced carrier wave. If the rotational speed of the record disc is low, the frequency of the reproduced carrier wave is, for example, approximately 1 KHz, is as indicated by curve I. Consequently, the reproduced carrier wave is greatly attenuated below −30 dB (in the order of −40 dB) and is not transmitted to the output terminal 16, being effectively eliminated. Accordingly, there is no possibility of an abnormal sound due to the carrier wave being reproduced with a frequency of 1 KHz.

Siimilarly, if the rotational speed of the disc is somewhat greater than that in the above described case, but has not yet reached the normal speed, the frequency of the reproduced carrier wave is, for example, approximately 5 KHz. The frequency response characteristic of the variable low-pass filter 14, controlled by a control signal in accordance with that frequency is as indicated by curve II in FIG. 4. Consequently, the reproduced carrier wave is effectively eliminated.

When the rotational speed of the disc increases further, and the reproduced carrier wave frequency becomes greater than 20 KHz, the circuit system 47 operates together with the circuit system 48, within the control signal generator 15. The control voltages of these circuit systems 47 and 48 are added and amplified in the DC amplifier 41. The resulting voltage is applied through the terminal 46 to the terminal 27 of the variable low-pass filter 14. As a result, the FETs 21 and 22 of the variable low-pass filter 14 assume a saturated state. The cut-off frequency of this filter 14 becomes higher than 20 KHz. Therefore, the frequency response of the variable low-pass filter 14, in this case, is as indicated by curve III (substantially a straight line) in FIG. 4.

Figure 5:
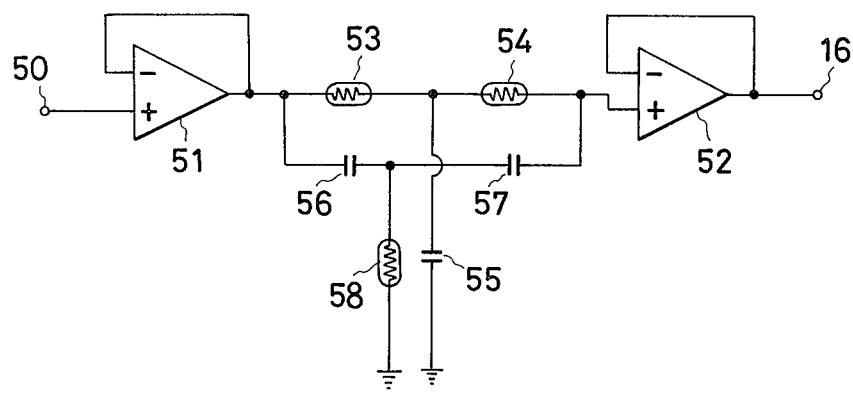
FIG. 5 is a circuit diagram of one embodiment of a variable band eliminating circuit which can be used in place of the variable low-pass filter of the system shown in FIG. 1.

In the above described embodiment, variable low-pass filters 14a and 14b have cut-off frequencies which can be varied responsive to a control signal from the control signal generator 15. A band elimination filter as shown in FIG. 5, for example, can also be used in place of these variable low-pass filters.

This band elimination filter comprises operational amplifiers 51 and 52 and a twin-T circuit including resistors 53 and 54, a capacitor 55, capacitors 56 and 57, and a resistor 58. Here, photocouplers comprising a combination of CdS and electro-luminescent diodes are used for the resistors 53, 54, and 58. The intensity of the luminescence of these electro-luminescent diodes is controlled by a control signal from the control siginal generator 15. The resistance values of resistors 53, 54 and 58 are variably controlled.

Figure 6:
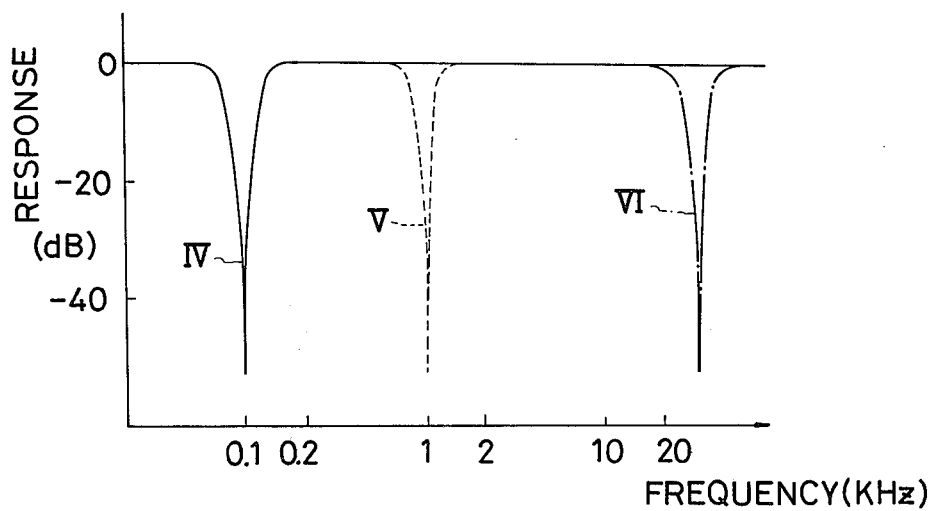
FIG. 6 is a graph indicating the frequency response characteristic of the circuit illustrated in FIG. 5.

The frequency response characteristic of the above mentioned band elimination filter is as indicated in FIG. 6. As the resistance values of the resistors 53, 54 and 58 are variably controlled by a control signal in accordance with the frequency of the reproduced carrier wave, the elimination bands thereof vary as indicated at IV, V, and VI in FIG. 6 in a manner to eliminate the reproduced carrier wave in accordance with the carrier wave frequency.

In terms of the resistance values R1, R2, and R3 of the resistors 53, 54, and 58, respectively, the capacitances C3, C4, and C5 of the capacitors 56, 57, and 55, respectively, and the central frequency $f_N$ of the elimination band, the following conditions are fulfilled.

$$R1 = R2 = 2R3$$
$$C3 = C4 = C5/2$$
$$f_N = \frac{1}{2\pi R1 \, C3}$$

Accordingly, a signal applied to the input terminal 50 from the amplifier 13 passes through a band elimination filter having a frequency response characteristic as indicated in FIG. 6. Its carrier wave component reproduced with a frequency below the normal frequency is effectively eliminated. The resulting signal is led out from the output terminal 16.

Further, this invention is not limited to these embodiments. Various variations and modifications may be made without departing from the scope and spirit of the invention.

What is claimed is:

1. An abnormal sound eliminating system for use in a record disc reproducing apparatus, said system comprising control signal generating means operated responsive to a multiplex signal of an angle-modulated wave signal and a direct wave signal picked up from a record disc on which the multiplex signals are recorded, said generating means producing a control signal having voltage which increases responsive to an increase of frequency of the carrier wave of the angle-modulated wave up to a predetermined frequency, low-pass filter means having a variable cut-off frequency, and means responsive to said control signal for controlling the cut-off frequency of said low-pass filter means, said cut-off frequency becoming higher as the voltage of the control signal increases and being lower than the frequency of the carrier wave while the frequency of the carrier wave is lower than the predetermined frequency, whereby said low-pass filter means responds to the multiplex signals picked up from the record disc and eliminates at least the carrier wave when it is reproduced from a record disc rotating at a speed which is lower than a specified rate.

2. An abnormal sound eliminating system according to claim 1 wherein said low-pass filter means attenuates the carrier wave with a response substantially in the order of from −30 dB to −40 dB while the frequency of the carrier wave is lower than the predetermined frequency.

3. An abnormal sound eliminating system according to claim 1 wherein said low-pass filter means comprises a variable resistance element having an internal resistance which is varied in accordance with the voltage of the control signal applied thereto whereby the cut-off frequency is varied.

4. An abnormal sound eliminating system according to claim 3 wherein said variable resistance element comprises dual-field-effect transistors respectively having gates with the control signal applied thereto.

5. An abnormal sound eliminating system according to claim 1 whrein said control signal generating means comprises first circuit means responsive to the multiplex signals picked up from the record disc for generating a first DC control voltage substantially proportional to the frequency of the carrier wave; second circuit means comprising high-pass filter means having a cut-off frequency substantially equal to the predetermined frequency, said high-pass filter means being responsive to the multiplex signals picked up from the record disc and passing components of the multiplex signals having frequencies higher than the cut-off frequency, phase locked loop circuit means including voltage controlled oscillator means, said phase locked loop circuit means being responsive to the output signal of said high-pass filter and locking in phase with the carrier wave when the frequency of the carrier wave is higher than the cut-off frequency of said high-pass filter means, multiplier means responsive to the signal from said voltage controlled oscillator means and the output signal of said high-pass filter means, said multiplier means generating an output synchronized with the frequency of the carrier wave only when said phase locked loop ciruit means locks to the carrier wave, integration circuit means for integrating the output signal of said multiplier means to produce a second DC cotnrol voltage; and means for supplying the first and second control voltages as a control signal to said low-pass filter means, whereby said low-pass filter means eliminates the carrier wave while the record disc is rotating at less than normal speed, said low-pass filter means passing the carrier wave while the speed of the record disc is equal to or higher than normal.

6. An abnormal sound eliminating system according to claim 5 wherein said first circuit means comprises differentiation circuit means responsive to the matrix signals for producing an output signal having an amplitude proportional to the frequency of the carrier wave, rectification circiut means for rectifying the output signal of said differentiation circuit means, and integration circuit means for integrating the output signal of said rectification circuit means to produce the first DC control voltage.

* * * * *